United States Patent [19]

Taylor, Jr. et al.

[11] Patent Number: 4,611,300
[45] Date of Patent: Sep. 9, 1986

[54] DIGITAL DELAY LINE

[75] Inventors: Wilson E. Taylor, Jr.; Larry E. Hand, both of Meridian, Miss.

[73] Assignee: Peavey Electronics Corp., Meridian, Miss.

[21] Appl. No.: 643,316

[22] Filed: Aug. 21, 1984

[51] Int. Cl.$^4$ .............................................. G11C 7/00
[52] U.S. Cl. ................................... 365/194; 364/900; 381/63; 328/155
[58] Field of Search ............ 365/194, 76, 233; 328/133, 155; 381/63; 364/900 MS File

[56] References Cited

U.S. PATENT DOCUMENTS 4,181,975 1/1980 Jenkins ............................... 364/900
4,318,183 3/1982 Byington et al. ................... 364/900

Primary Examiner—Joseph A. Popek
Attorney, Agent, or Firm—Berman, Aisenberg & Platt

[57] ABSTRACT

A digital delay system employs a phase-locked loop to control a recall address generator. The phase-locked loop comprises a subtractor for determining the difference between the store address and the recall address and for producing a phase signal corresponding to this difference. The phase signal is directed to a voltage controlled oscillator for controlling the rate at which the recall address generator recalls data from a memory. A delay length is introduced as a phase error into the phase-locked loop. Input data is stored in a memory at a fixed rate, and recalled from the memory at a rate determined by the phase-locked loop. When the error signal is zero, the recall address rate will equal the store address rate and the respective addresses will be equal. When an error signal is introduced into the loop, the VCO will cause the recall address to advance or retard to produce the desired delay, and after the delay has been produced, the phase-locked loop will ensure that the recall address rate is equal to the store address rate. The phase error may be either a constant signal or a low-frequency signal.

13 Claims, 1 Drawing Figure

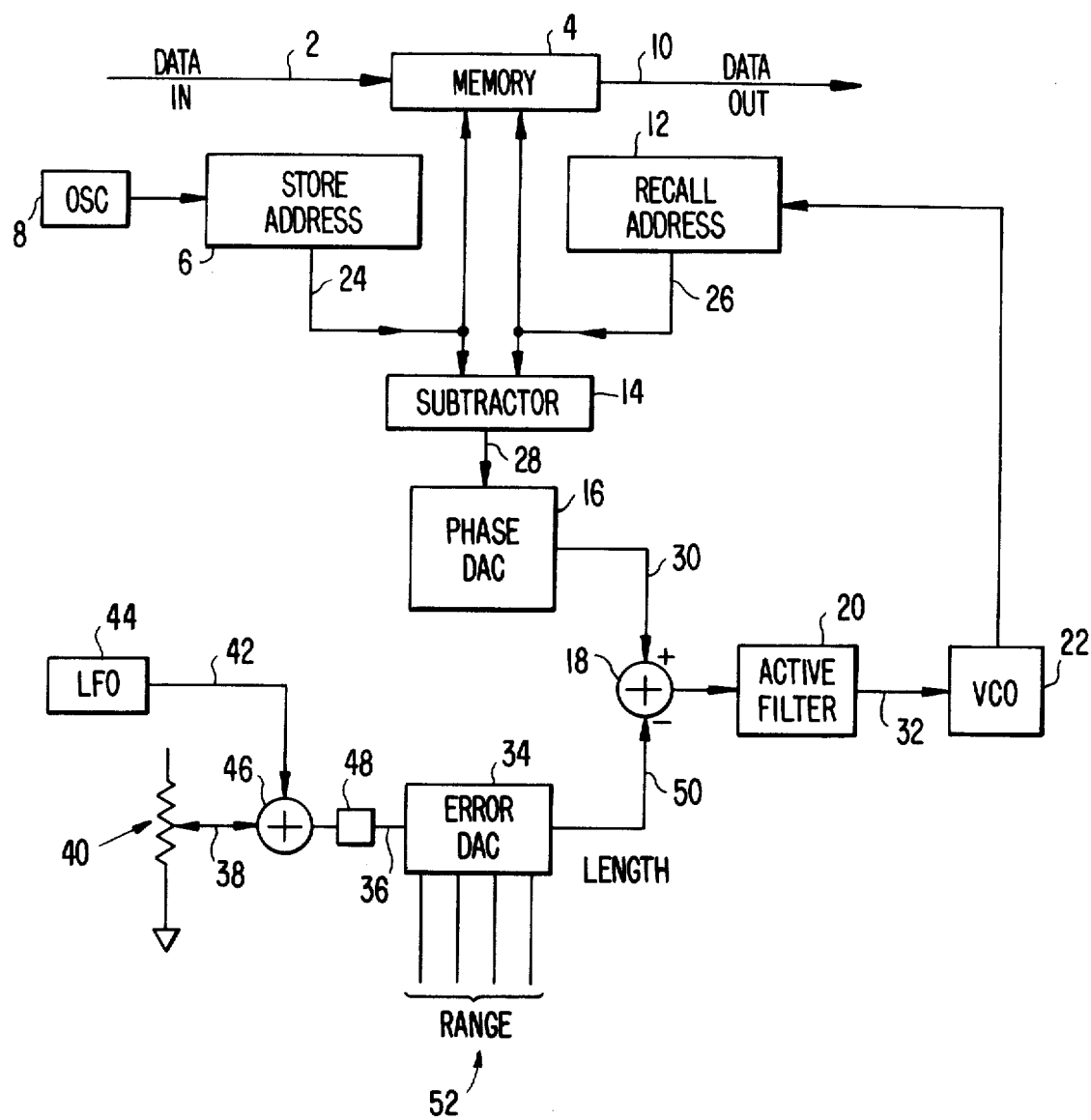

DIGITAL DELAY LINE

FIELD OF THE INVENTION

This invention relates to the art of electronic delay lines, particularly those useful in digital electronic systems.

BACKGROUND ART

A phenomenon known in the art of acoustics is that of the echo. During a musical performance, a listener will detect sound waves coming directly from the musician, or a loudspeaker, and will also receive sound waves which have been reflected from an object, such as the wall or ceiling of an auditorium. The reflected sound is typically delayed by a small period of time and contributes to the overall sensation by the listener.

In an attempt to recreate this sensation, it is known to electronically delay a part of the signal driving a loudspeaker so that the speaker essentially broadcasts the direct sound wave and a simulation of the reflected sound wave. The delayed signal is produced by an electronic delay line.

In addition to the desire to recreate the echo effect, modern musicians use a variety of delay times to create particular types of music.

Many of the prior techniques utilize analog circuits, but the music industry is rapidly turning to digital electronic techniques for amplification of audio signals. A typical digital audio system directs an input to an analog-to-digital converter (ADC) followed by a digital signal processor and a digital-to-analog converter (DAC), the output of which is connected to a speaker.

It is known that a delay of a digital signal can be produced by storing the digital signal in a memory and reading the signal out of the memory at a later time. For example, if the recall address is shifted from the store address by a number of storage elements, the delay time will be equal to the product of the sample rate and the difference between the store address and the recall address. The delay length in accordance with this technique is typically varied by altering the sample rate.

U.S. Pat. No. 4,005,268 (Canell et al.) shows a solid-state echo producing system wherein an analog input signal is converted to a digital signal, and the digital signal is then directed to a series of shift registers. The signal is read out of the shift registers and converted back to an analog signal. The shift registers are controlled by a clock of variable frequency to alter the length of the delay.

Systems such as those shown in Cannell et al. have extremely limited delay variability and require input and output filtering to vary also in accordance with the changing sample rate in order to obtain optimum performance of the system.

Another type of digital delay system employs storage and recall address generators which are separately controllable. U.S. Pat. No. 4,181,975 (Jenkins) shows a digital delay line wherein an input signal is stored in a memory in accordance with a clock rate. The signal is read out of the storage medium by a recall address generator controlled by a voltage controlled oscillator (VCO). The recall address generator frequency is determined by a comparison of the store and recall addresses to produce a phase signal which is used as the input to the VCO.

SUMMARY OF THE INVENTION

In accordance with the invention, a digital delay line is provided wherein a storage address generator is controlled by a fixed oscillator. The recall address generator is controlled by a voltage controlled oscillator (VCO) and thus has a variable frequency. A phase-locked loop is employed to control the recall address generator to ensure that the recall address rate is equal to the storage address rate for a fixed delay. The phase-locked loop also ensures that the store address is equal to the recall address when no delay is desired, e.g., a delay length of zero.

A phased-locked loop in accordance with the invention comprises a subtractor for determining the difference between the storage address and the recall address and for producing a digital signal representative thereof. A digital-to-analog converter (DAC) then converts the output from the subtractor into an analog signals which is filtered and applied to the input of the VCO. The output of the VCO in turn controls the recall address generator. Thus, if no delay is desired, the loop will ensure that the store address is equal to the recall address.

In order to introduce a desired delay, an error DAC is used to produce an analog error signal which is added to the phase signal of the phase DAC, and the sum of the phase and error signals is applied to the input of the VCO by way of a low-pass, active filter.

The error DAC receives a base delay input which is alternatively modulated by a sine wave, or a triangular wave or a combination thereof, by a low-frequency oscillator (LFO). The error DAC is preferably of the multiplying type wherein a desired range is set as the digital input such that a variation in the reference voltage causes a variation in the output. The output is then a percentage of the range designation.

The apparatus of the invention produces a delay which is adjustable continuously from about 0.1 milliseconds to about 1.3 seconds with an even signal quality. The delay line operates with a full audio band width for all delay lengths and is thus useful with a variety of electronic systems.

An object of this invention is to provide a delay circuit for a digital electronic system.

Another object of this invention is to provide a digital delay circuit wherein a recall address generator is part of a phase-locked loop.

A still further object of this invention is to provide a digital electronic system wherein data is stored in a memory in accordance with a fixed rate, and a recall address generator is part of a phase-locked loop which includes an element for introducing a phase error into the loop to produce a desired delay.

Yet another object of the invention is to provide a phase-locked loop for controlling a digital memory system wherein a phase error is introduced by an error means controlled by a low frequency oscillator to produce a constantly varying delay length.

BRIEF DESCRIPTION OF THE DRAWINGS

The FIGURE is a block diagram of the invention.

DETAILED DESCRIPTION OF THE INVENTION

With reference to the figure, a data stream 2 comprises digital data directed to an input terminal of a memory device 4. The input data stream may originate as digital data, or may originate as analog data and be converted to digital form by an analog-to-digital converter (ADC). The digital data is stored in memory locations of meomory 4, and these locations are determined by a store address generator 6 which is operatively connected to memory 4. In the preferred embodiment, the store address generator 6 is controlled by a fixed oscillator 8 such that the data in data stream 2 is stored in sequential memory locations in the memory device 4 at a fixed sampling rate.

Output data stream 10 is produced by recaling the data stored in memory 4. The output data is in digital format and may be used directly or may be converted to analog form by a digital-to-analog converter (DAC). The output data is recalled and caused to be read out of the memory device 4 by a recall address generator 12 which is operatively connected to the memory device 4.

Recall address generator 12 is controlled by a phase-locked loop which includes a subtractor 14, a phase converter 16, an error node 18, a filter 20, and a voltage controlled oscillator (VCO) 22. The addressing signal 24 of the store address generator and the addressing signal 26 of the recall address generator are applied as inputs to the subtractor 14, which determines the difference between the respective addresses and produces an output 28 representative of this difference. The output 28 is preferably in digital form and is applied to a phase DAC 16 to produce an analog output 30 which is representative of the difference between the store and recall addresses. The signal 30 is combined with an error signal at a summing node 18 and then applied as input 32 to the VCO 22 by way of active filter 20. The VCO 22 in turn produces an output frequency which controls recall address generator 12.

A delay length, or error, is introduced into the phase-locked loop by an error generator 34 which is preferably a multiplying DAC. The error DAC 34 is controlled by an input 36 which sets the reference voltage of the DAC 34, and range inputs 52. Input 36 is the sum of an adjustable base delay 38 illustrated by a moveable tap on voltage-divider resistor 40 and a low-frequency delay signal 42 produced by low frequency oscillator (LFO) 44. The signals 38 and 42 are combined at summing node 46 and pass through a limiter 48 to produce the input 36. In the preferred embodiment, error DAC 34 operates such that the input signal 36 causes a proportional variation in the range setting 52 to produce the output analog signal 50. Thus, if the range setting 52 is a given delay, the signal 36 will cause a 0 to 100 percent variation of that given delay. In the preferred embodiment, the signal 50 is opposite in sign to that of signal 30, and the node 18 is a summing node.

The low frequency oscillator 44 produces either a sinusoid or a triangular wave, or a combination of these wave forms. LFO 44 may alternatively be disabled so that signal 36 is constant. When the LFO 44 modulates voltage 38, error DAC 34 produces a constantly varying output 50 which produces a constantly varying delay between the input data stream 2 and the output data stream 10.

The phase DAC 16 and the error DAC 34 are preferably multiplying converters, and the filter 20 is preferably an active loop filter.

OPERATION

Input data 2 is stored in a plurality of sequential memory locations in the memory device 4, and these locations are determined by the store address generator 6. Since the store address generator 6 operates at a fixed frequency caused by oscillator 8, the data is sequentially loaded into the individual locations at a fixed frequency. When the length signal 50 is zero, the VCO 22 will drive the recall address generator 12 such that the recall address and store address are equal. The phase-locked loop will maintain the frequency at which the store address generator operates and the frequency at which the recall address generator operates equal, and there will be no delay between the input data stream 2 and the output data stream 10. When the error DAC 34 produces a non-zero signal 50, which is preferably inverted with respect to signal 30, the node 18 will effectively determine the difference between the signals 30 and 50. This will introduce a phase error into the phase-locked loop and will thus cause the VCO 22 to drive the recall address generator 12 to operate at a frequency differing from that of the store address generator. When the recall addresses have advanced, or retarded, to such a point that the difference between the store address and the recall address produces a phase corresponding to that of the delay length 50, the VCO will operate at a fixed frequency, and the output data stream 10 will be delayed with respect to the input data stream 4 by the product of the frequency of the oscillator 8 and the VCO 22, and the difference between the store and recall addresses.

The phase-locked loop ensures that the recall and store rates are identical when the length output from the error DAC 34 is constant. For a zero input at the length node 18, the loop ensures that the store and recall addresses have a phase difference of zero, which means that the recall address is equal to the store address.

It will be appreciated that the circuit provides a digital delay whose length can be easily varied by adjusting the length input 50. Because the system employs a constant sampling rate, no extraordinary filtering technique is required to produce a high performance delay system. Modifications within the scope of the appended claims will be apparent to those of skill in the art.

What is claimed is:

1. A delay circuit comprising
    digital memory means having an input for receiving input digital signals and an output for producing output digital signals;
    store address means for causing said input digital signals to be stored at a plurality of locations in said memory means;
    recall address means for causing said memory means to recall data from selected ones of said plurality of locations to produce said output digital signals;
    a phase-locked loop for controlling said recall address means, said phase-locked loop comprising subtractor means for producing a difference signal representative of the difference between the locations in which said input signal is stored and from which said output signal is recalled, phase converter means for converting said difference signal into a first control signal, phase input means for producing a second control signal, and oscillator means controlled by said first and second control signals, said oscillator means producing an output for controlling the rate at which said recall address means recalls data from said memory means.

2. A delay circuit according to claim 1 wherein said store address means comprises a fixed-frequency oscillator for causing said store address means to store said input digital signals in sequential ones of said plurality of locations at a constant rate.

3. A delay circuit according to claim 2 wherein said difference signal is in digital format and said phase converter means comprises a digital-to-analogue converter, and wherein said phase input means comprises a digital-to-analogue converter.

4. A delay circuit according to claim 1 wherein said phase input means comprises oscillator means for producing a varying said second control signal.

5. A delay circuit according to claim 4 wherein said oscillator means produces a sinusoidally varying signal.

6. A delay circuit according to claim 4 wherein said oscillator means produces a signal having a triangular-shaped voltage.

7. A delay circuit according to claim 1 wherein said phase input means comprises a multiplying digital-to-analog converter having a digital range input and a reference voltage input, and reference voltage means for applying a selectable reference voltage to said reference voltage input.

8. A delay circuit according to claim 7 wherein said reference voltage means comprises a low frequency oscillator.

9. A delay circuit according to claim 8 wherein said reference voltage means further comprises a voltage divider for producing a variable voltage and means for combining a low frequency output from said low frequency oscillator with said variable voltage.

10. Apparatus according to claim 9 wherein said low frequency oscillator is capable of selectively producing a sinusoidal or a triangular output waveform.

11. A method for delaying first digital signals with respect to second digital signals comprising the steps of loading said first digital signals into a plurality of respective locations in a memory means at a storage rate, recalling data from said plurality of locations at a recall rate, and controlling the difference between said storage rate and said recall rate by applying a signal representative of the difference between locations in which data is stored and from which data is recalled and a phase error signal to a voltage controlled oscillator, and applying the output of said voltage controlled oscillator to an address generator.

12. A method according to claim 11 wherein said address generator is a recall address generator and the storage rate is constant.

13. A method according to claim 12 wherein said phase error signal is a low frequency modulated signal.

* * * * *